US010444261B2

(12) United States Patent
Masuda

(10) Patent No.: US 10,444,261 B2
(45) Date of Patent: Oct. 15, 2019

(54) SIGNAL DETECTOR, ELECTRONIC DEVICE, AND METHOD FOR CONTROLLING SIGNAL DETECTOR

(71) Applicant: SONY CORPORATION, Tokyo (JP)

(72) Inventor: Takashi Masuda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 70 days.

(21) Appl. No.: 15/533,453

(22) PCT Filed: Oct. 7, 2015

(86) PCT No.: PCT/JP2015/078513
§ 371 (c)(1),
(2) Date: Jun. 6, 2017

(87) PCT Pub. No.: WO2016/103845
PCT Pub. Date: Jun. 30, 2016

(65) Prior Publication Data
US 2018/0024170 A1    Jan. 25, 2018

(30) Foreign Application Priority Data

Dec. 22, 2014    (JP) ................................. 2014-258192

(51) Int. Cl.
*G01R 19/00*    (2006.01)
*H03K 3/0233*    (2006.01)
(Continued)

(52) U.S. Cl.
CPC ......... *G01R 19/0038* (2013.01); *G01R 17/02* (2013.01); *G01R 19/0053* (2013.01);
(Continued)

(58) Field of Classification Search
CPC ........... G01R 19/38; H03F 2203/45151; H03F 2203/45156; H03F 2203/45138; H03F 2203/45222

See application file for complete search history.

(56) References Cited

U.S. PATENT DOCUMENTS 6,072,366 A * 6/2000 Maeda ............... H04B 10/6931
250/214 A
6,664,816 B1 * 12/2003 Nguyen ................. H03K 5/153
327/74

(Continued)

FOREIGN PATENT DOCUMENTS

EP    1193902 A2    4/2002
JP    05-211478 A    8/1993
(Continued)

OTHER PUBLICATIONS

Chen, et al.,"A Limiting Amplifier with LOS Indication for Gigabit Ethernet", pp. 04.

(Continued)

*Primary Examiner* — Tung X Nguyen
*Assistant Examiner* — Dominic E Hawkins
(74) *Attorney, Agent, or Firm* — Chip Law Group

(57) ABSTRACT

To accurately detect the presence or absence of a signal. A signal detector includes an input-signal amplifying circuit, a reference-signal amplifying circuit, and a comparator. In the signal detector, the input-signal amplifying circuit amplifies an input signal with a predetermined gain. The reference-signal amplifying circuit amplifies a reference signal at a constant signal-level with a gain that substantially matches the predetermined gain. The comparator compares a signal level of the amplified input signal with a signal level of the amplified reference signal, and outputs the comparison result as a detection signal.

8 Claims, 11 Drawing Sheets

(51) Int. Cl.
　　　*G01R 17/02*　　　(2006.01)
　　　*H03F 3/45*　　　(2006.01)
　　　*H03F 3/08*　　　(2006.01)
　　　*H03K 5/08*　　　(2006.01)
　　　*H04B 10/69*　　(2013.01)

(52) U.S. Cl.
　　　CPC ......... *H03F 3/087* (2013.01); *H03F 3/45475* (2013.01); *H03K 3/0233* (2013.01); *H03K 5/086* (2013.01); *H04B 10/69* (2013.01); *H03F 2200/405* (2013.01); *H03F 2200/453* (2013.01); *H03F 2203/45138* (2013.01); *H03F 2203/45151* (2013.01); *H03F 2203/45156* (2013.01); *H03F 2203/45222* (2013.01)

(56) References Cited

U.S. PATENT DOCUMENTS

| | | | | |
|---|---|---|---|---|
| 7,809,052 | B2 * | 10/2010 | Li | G01R 31/31709 375/226 |
| 2002/0036810 | A1 | 3/2002 | Noguchi | |
| 2003/0174023 | A1 * | 9/2003 | Miyasita | H03F 3/45085 330/254 |
| 2004/0051557 | A1 * | 3/2004 | Kim | H03K 5/088 326/82 |
| 2005/0012549 | A1 * | 1/2005 | Takeda | H03G 3/3084 330/140 |
| 2005/0186930 | A1 * | 8/2005 | Rofougaran | H03B 27/00 455/260 |
| 2005/0200404 | A1 * | 9/2005 | Bernardon | H03F 3/195 330/10 |
| 2006/0044070 | A1 * | 3/2006 | Fujita | H03F 3/087 330/308 |
| 2008/0036536 | A1 * | 2/2008 | Khorramabadi | H01F 17/0013 330/252 |
| 2013/0249626 | A1 * | 9/2013 | Matsunaga | H03F 1/0277 330/51 |

FOREIGN PATENT DOCUMENTS

| | | |
|---|---|---|
| JP | 5-211478 A | 8/1993 |
| JP | 2002-111587 A | 4/2002 |
| JP | 2011-041058 A | 2/2011 |
| JP | 2011-41058 A | 2/2011 |
| JP | 2014-155015 A | 8/2014 |
| WO | 2014/122715 A1 | 8/2014 |

OTHER PUBLICATIONS

Chen, et al., "A Limiting Amplifier with LOS Indication for Gigabit Ethernet", 2008 IEEE, 04 pages.

International Search Report and Written Opinion of PCT Application No. PCT/JP2015/078513, dated Nov. 24, 2015, 02 pages of English Translation and 07 pages of ISRWO.

* cited by examiner

SIGNAL DETECTOR, ELECTRONIC DEVICE, AND METHOD FOR CONTROLLING SIGNAL DETECTOR

CROSS REFERENCE TO RELATED APPLICATIONS

This application is a U.S. National Phase of International Patent Application No. PCT/JP2015/078513 filed on Oct. 7, 2015, which claims priority benefit of Japanese Patent Application No. JP 2014-258192 filed in the Japan Patent Office on Dec. 22, 2014. Each of the above-referenced applications is hereby incorporated herein by reference in its entirety.

TECHNICAL FIELD

The present technology relates to a signal detector, an electronic device, and a method for controlling the signal detector, and specifically relates to a signal detector that detects a presence or absence of a signal exceeding a reference level, an electronic device, and a method for controlling the signal detector.

BACKGROUND ART

Conventionally, in a case where a reception signal is weak, an amplifying circuit for amplifying the signal is used in a communication device and the like. However, in the amplifying circuit, not only the reception signal but also noise is amplified. Therefore, it is necessary to provide a signal detector that determines whether the signal amplified by the amplifying circuit is the reception signal or noise (that is, presence or absence of the reception signal). In a case of the reception signal, a signal processing circuit at the post stage of the signal detector performs signal processing on the reception signal. In a case of the noise, the signal processing is not performed. For example, such a signal detector is proposed that a comparator that compares the signal level of the amplified signal with a fixed reference level is provided and the presence or absence of the reception signal is detected on the basis of whether or not the signal level is higher than the reference level (e.g., refer to Non-Patent Literature 1).

CITATION LIST

Non-Patent Literature

Non-Patent Literature 1: W. B. Chen, et al, "A Limiting Amplifier with LOS Indication for Gigabit Ethernet (registered trademark)", IEEE International Conference on Electron Devices and Solid-State Circuits (EDSSC), 2008

DISCLOSURE OF INVENTION

Technical Problem

However, the above-mentioned signal detector may erroneously detect the presence or absence of a reception signal in a case where a gain of the amplifying circuit greatly changes due to a change of a so-called process/voltage/temperature (PVT) condition as a process/voltage/temperature condition. For example, if a gain of the amplifying circuit is increased due to the change of the PVT condition, the level of amplified noise becomes higher than a reference level, and thus there may be a danger of erroneously detecting the noise as the reception signal. On the other hand, if a gain is reduced, the signal level after the amplification becomes the reference level or less, and thus there may be a danger of erroneously detecting that the reception signal is not input despite of input of the reception signal,. As mentioned above, there is a problem that the presence or absence of the signal cannot be accurately detected with the communication device.

The present technology is devised in consideration of the situation, and has an object to accurately detect the presence or absence of the signal.

Solution to Problem

The present technology is devised to solve the above-described problem, and a first aspect thereof is a signal detector and a method for controlling the signal detector, the signal detector including: an input-signal amplifying circuit configured to amplify an input signal with a predetermined gain; a reference-signal amplifying circuit configured to amplify a reference signal at a constant signal level with a gain that substantially matches the predetermined gain; and a comparator configured to compare a signal level of the amplified input signal with a signal level of the amplified reference signal and output a comparison result as a detection signal. This brings about an effect of comparing the signal levels of the input signal and the reference signal that are amplified with the substantially identical gain with each other.

Further, according to the first aspect, each of the input signal and the reference signal may be a periodic signal whose value changes for a constant period, and a frequency of the reference signal may be lower than that of the input signal. This brings about an effect of amplifying the reference signal at a frequency lower than that of the input signal.

Further, according to the first aspect, the signal detector may further include: an input-signal amplitude detecting circuit configured to detect an amplitude of the amplified input signal and supply the amplitude to the comparator as the signal level; and a reference-signal amplitude detecting circuit configured to detect an amplitude of the amplified reference signal and supply the amplitude to the comparator as the signal level. This brings about an effect of detecting the amplitudes of the amplified input signal and reference signal.

Further, according to the first aspect, the input-signal amplitude detecting circuit may detect an amplitude of the input signal with full-wave rectification of the amplified input signal. The reference-signal amplitude detecting circuit may detect an amplitude of the reference signal with full-wave rectification of the amplified reference signal. This brings about an effect of detecting the amplitude with full-wave rectification.

Further, according to the first aspect, the input-signal amplitude detecting circuit may detect a peak value of the amplified input signal as an amplitude of the input signal. The reference-signal amplitude detecting circuit may detect a peak value of the amplified reference signal as an amplitude of the reference signal. This brings about an effect of detecting the peak values of the input signal and the reference signal as amplitudes.

Further, according to the first aspect, the input-signal amplifying circuit may include an input-side amplifier configured to amplify the input signal with the predetermined gain, and an input-side offset compensating circuit configured to compensate for an offset voltage of the input-side amplifier on a basis of the amplified input signal. The reference-signal amplifying circuit may include a reference-side amplifier configured to amplify the reference signal with the predetermined gain, and a reference-side offset compensating circuit configured to compensate for an offset voltage of the reference-side amplifier on a basis of the amplified reference signal. This brings about an effect of securing the offset voltage.

Further, according to the first aspect, the input-signal amplifying circuit may include an input-side amplifier configured to amplify the input signal with the predetermined gain, and an input-side high-pass filter configured to pass a high-frequency component higher than a predetermined cutoff frequency. The reference-signal amplifying circuit may include a reference-side amplifier configured to amplify the reference signal with the predetermined gain, and a reference-side high-pass filter configured to pass a high-frequency component higher than the predetermined cutoff frequency. This brings about an effect of comparing frequency components higher than the cutoff frequency.

Further, a second aspect of the present technology is an electronic device including: an input-signal amplifying circuit configured to amplify an input signal with a predetermined gain; a reference-signal amplifying circuit configured to amplify a reference signal at a constant signal level with a gain that substantially matches the predetermined gain; a comparator configured to compare a signal level of the amplified input signal with a signal level of the amplified reference signal and output a comparison result as a detection signal; and a signal processing unit configured to perform predetermined signal processing on the amplified input signal, in a case where the detection signal indicating that the signal level of the input single is higher than that of the reference signal is output. This brings about an effect of comparing the signal levels of the input signal and the reference signal that are amplified with the substantially identical gain with each other.

Advantageous Effects of Invention

According to the present technology, an excellent advantage can be exhibited to accurately detect the presence or absence of a signal. Note that the advantage described here is not necessarily limited, and any advantage described in the present disclosure may be used.

MODE(S) FOR CARRYING OUT THE INVENTION

Hereinbelow, a description will be given of forms to implement the present technology (hereinafter, called an embodiment). The description will be given in the following order.

1. First embodiment (example of amplifying an input signal and a reference signal)
2. Second embodiment (example of amplifying an input signal and a reference signal and holding a peak value)
3. Third embodiment (example of amplifying an input signal and a reference signal and compensating for offset)
4. Fourth embodiment (example of amplifying an input signal and a reference signal and passing through a high-pass filter)

<1. First Embodiment>

[Configuration Example of Communication Device]

Figure 1:
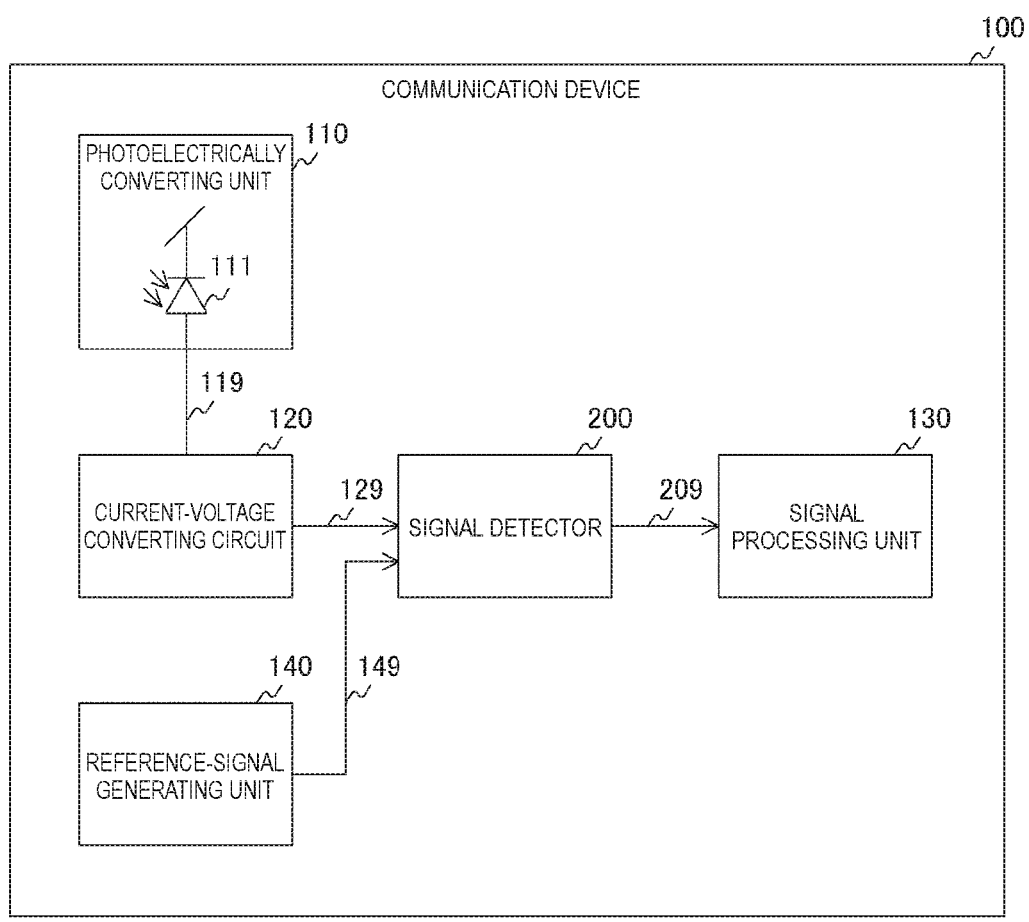
FIG. 1 is a block diagram showing a configuration example of a communication device according to a first embodiment.

FIG. 1 is a block diagram showing a configuration example of a communication device 100 according to a first embodiment. The communication device 100 includes: a photoelectrically converting unit 110; a current-voltage converting circuit 120; a signal detector 200; a signal processing unit 130; and a reference-signal generating unit 140. The photoelectrically converting unit 110 includes a photodiode 111.

The photodiode 111 converts an optical signal received via an optical fiber or the like into a current signal. The photodiode 111 supplies a current signal to the current-voltage converting circuit 120 via a signal line 119.

The current-voltage converting circuit 120 converts a current signal into a voltage signal. The current-voltage converting circuit 120 supplies a voltage signal as an input signal to the signal detector 200 via a signal line 129. As the input signal, for example, a differential signal with a clock signal is supplied.

The signal detector 200 detects the presence or absence of an input signal at a signal level higher than a preset constant level (hereinbelow, called a 'reference level'). As the signal level, for example, a voltage value is used. The signal detector 200 detects the presence or absence of an input signal from the current-voltage converting circuit 120 by using the reference signal from the reference-signal generating unit 140. The signal detector 200 supplies a detection signal indicating a detection result to the signal processing unit 130 via a signal line 209. Further, the signal detector 200 amplifies the input signal and supplies the signal as an output signal to the signal processing unit 130.

The reference-signal generating unit 140 generates a signal at the reference level as the reference signal. As the reference signal, for example, a differential signal with a clock signal is generated. The reference-signal generating unit 140 supplies the generated reference signal to the signal detector 200 via a signal line 149. Here, preferably, the reference-signal generating unit 140 generates, as the reference signal, a clock signal with a frequency lower than that of the input signal.

The signal processing unit 130 performs predetermined signal processing on an output signal from the signal detector 200 on the basis of a detection signal. For example, in a case where the detection signal indicates that there is an input signal at the signal level higher than the reference level, the signal processing unit 130 performs signal processing, such as demodulating processing, on the output signal.

Note that the communication device 100 inputs a voltage signal as an input signal to the signal detector 200. However, in a case where the signal processing unit 130 handles a current input, the current signal may be input as the input signal. In this case, the current-voltage converting circuit 120 does not need to be provided to the communication device 100. Further, a current value is used as the signal level.

Further, the signal detector 200 is provided to the communication device 100, but the signal detector 200 may be provided to an electronic device other than the communication device. Further, the communication device 100 is an example of the electronic device according to the claims.

[Signal Detector]

Figure 2:
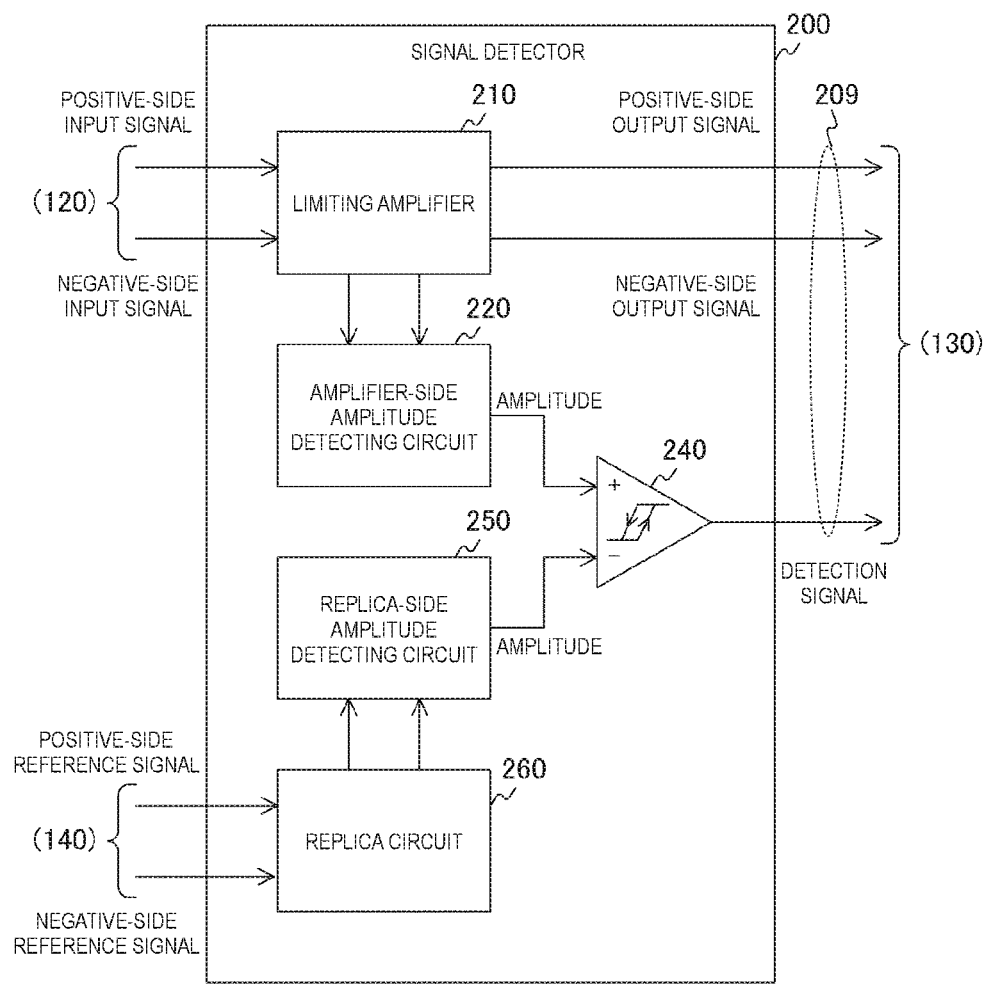
FIG. 2 is a block diagram showing a configuration example of a signal detector according to the first embodiment.

FIG. 2 is a block diagram showing a configuration example of the signal detector 200 according to the first embodiment. The signal detector 200 includes: a limiting amplifier 210; an amplifier-side amplitude detecting circuit 220; a comparator 240; a replica-side amplitude detecting circuit 250; and a replica circuit 260.

The limiting amplifier 210 amplifies an input signal with a predetermined gain. An input signal having a positive-side input signal and a negative-side input signal with different phases of 180 degrees is input to the limiting amplifier 210. The limiting amplifier 210 amplifies the input signal within a range not exceeding a certain limitation level with a predetermined gain Ga, and supplies the signal to the amplifier-side amplitude detecting circuit 220.

Further, the limiting amplifier 210 amplifies the input signal within a range not exceeding a certain limitation level with a gain Gb larger than Ga, and supplies the signal as an output signal to the signal processing unit 130. The output signal includes a positive-side output signal and a negative-side output signal with different phases of 180 degrees.

The amplifier-side amplitude detecting circuit 220 detects the amplitude of the amplified input signal as a signal level. The amplifier-side amplitude detecting circuit 220 supplies the detected amplitude (that is, signal level) to a non-inverting input terminal (+) of the comparator 240. Note that the amplifier-side amplitude detecting circuit is an example of an input-side amplitude detecting circuit according to the claims.

The replica circuit 260 amplifies the reference signal with a gain Ga' substantially matching the gain Ga. For example, a reference signal having a positive-side reference signal and a negative-side reference signal with different phases of 180 degrees is input to the replica circuit 260. Herein, the substantial matching between Ga and Ga' means that the difference between Ga and Ga' is within a predetermined permitting range (e.g., ±0.1 decibel). The replica circuit 260 supplies the amplified reference signal to the replica-side amplitude detecting circuit 250. Note that the replica circuit 260 is an example of a reference-signal amplifying circuit according to the claims.

Moreover, a gain of the replica circuit 260 matches a gain of the limiting amplifier 210, but the embodiment is not limited to the configuration. Since an amplifier is provided also to the current-voltage converting circuit 120, a gain of the replica circuit 260 may be set further in consideration of the gain of the amplifier. With decibel notation, in a case where a gain of the current-voltage converting circuit 120 is Gc, the same gain as Ga+Gc is set as the gain of the replica circuit 260.

Furthermore, as mentioned above, if the reference-signal generating unit 240 is configured to generate the reference signal at a frequency lower than that of the input signal, power consumption of the replica circuit 260 can be reduced.

The replica-side amplitude detecting circuit 250 detects an amplitude of the amplified reference signal as the signal level. The replica-side amplitude detecting circuit 250 supplies the detected amplitude (that is, signal level) to an inverting input terminal (−) of the comparator 240. Note that the replica-side amplitude detecting circuit is an example of a reference-side amplitude detecting circuit according to the claims.

The comparator 240 compares a signal level (amplitude) of the amplified input signal with the signal level (amplitude) of the amplified reference signal, and outputs a comparison result as a detection signal. As the comparator 240, for example, a comparator with hysteresis is used. Herein, the comparator with hysteresis is a comparator in which a voltage between input terminals when an output terminal inverts from a high level to a low level is different from a voltage between input terminals when the output terminal inverts from a low level to a high level. Note that a comparator without a hysteresis may be provided as the comparator 240. Further, the comparator 240 is an example of a comparator according to the claims.

Note that, with the signal detector 200, the input signal and the reference signal are differential signals, but these signals may be single-end signals. Further, the input signal and the reference signal are signals with the clock signal, but these signals may be signals that do not correspond to the clock signals. In a case where the input signal and the reference signal are signals that are not periodically changed, the amplifier-side amplitude detecting circuit 220 and the replica-side amplitude detecting circuit 250 do not need to be provided to the signal detector 200.

[Configuration Example of Limiting Amplifier and Replica Circuit]

Figure 3A:
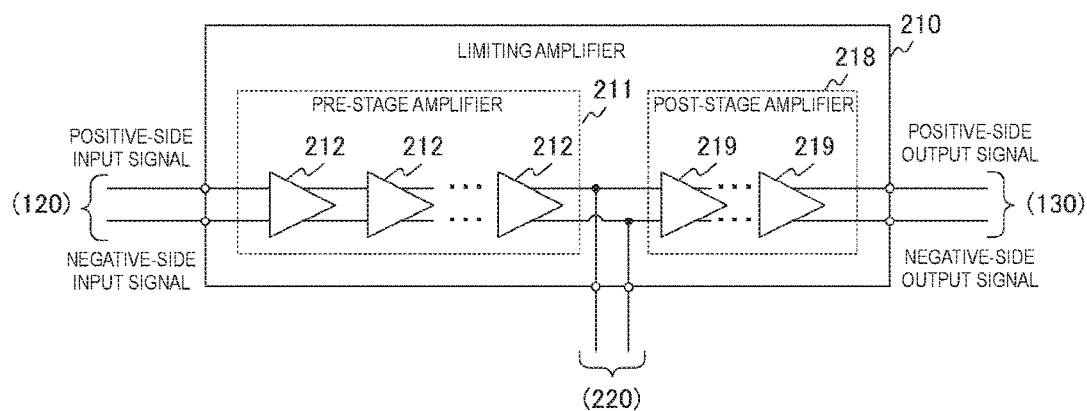
FIGS. 3a and 3b illustrate circuit diagrams showing configuration examples of a limiting amplifier and a replica circuit according to the first embodiment.
Figure 3B:
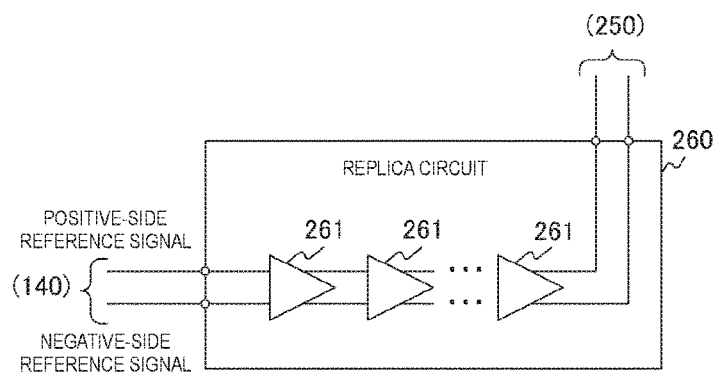

FIGS. 3a and 3b illustrate circuit diagrams showing configuration examples of the limiting amplifier 210 and the replica circuit 260 according to the first embodiment, in which FIG. 3a is a circuit diagram showing the configuration example of the limiting amplifier 210, and FIG. 3b is a circuit diagram showing the configuration example of the replica circuit 260.

The limiting amplifier 210 includes a pre-stage amplifier 211 having a differential amplifier 212 with a predetermined number of stages and a post-stage amplifier 218 having a differential amplifier 219 with a predetermined number of stages. The pre-stage amplifier 211 amplifiers the input signal with a gain Ga. The pre-stage amplifier 211 supplies the amplified input signal to the amplifier-side amplitude detecting circuit 220 and the post-stage amplifier 218. Note that the differential amplifier 212 is an example of an input-side amplifier according to the claims.

The post-stage amplifier 218 amplifies the input signal from the pre-stage amplifier 211 and outputs the signal as the output signal to the signal processing unit 130. A gain of the whole pre-stage amplifier 211 and post-stage amplifier 218 corresponds to Gb as mentioned above. Specifically, a gain of the post-stage amplifier 218 is Gb-Ga with the decibel notation.

Herein, a maximal value is set to the number of stages of the pre-stage amplifier 211 so that the signal level after the amplification in the pre-stage amplifier 211 is a limitation level or less. For example, in a case where the total number of stages of the pre-stage amplifier 211 and the post-stage amplifier 218 is 10 and the signal level at the fifth stage exceeds the limitation level, the number of stages of the pre-stage amplifier 211 is set to four. The reason is that at the fifth stage and later stages, at which the signal level is limited, the signal level is limited, while the noise level is amplified as long as it does not reach the limitation level, and thus it is hard to separate the signal from the noise.

Note that the signal detector 200 has the limiting amplifier 210 that limits the signal level. However, in place of the limiting amplifier 210, an amplifying circuit that does not limit the signal level may be provided. With the configuration, the differential amplifier 212 with a predetermined number of stages is provided to the amplifying circuit, and an output terminal at the final stage is connected to the signal processing unit 130 and the amplifier-side amplitude detecting circuit 220.

On the other hand, the replica circuit 260 has a differential amplifier 261 with a predetermined number of stages. A value at which the gain of the pre-stage amplifier 211 is substantially identical to the gain of the replica circuit 260 is set to the number of stages of the differential amplifier 261. For example, in a case where the gain of the differential amplifier 212 is identical to the gain of the differential amplifier 261, the numbers of stages thereof are set to be identical. Further, in a case where the gain of the differential amplifier 261 is twice the gain of the differential amplifier 212 with the decibel notation, the number of stages of the differential amplifier 261 is set to half the number of stages of the differential amplifier 212. Furthermore, gain characteristics of the differential amplifier 261 to the change in PVT condition are substantially identical to those of the differential amplifier 212. Note that the differential amplifier 261 is an example of the reference-side amplifier according to the claims.

[Configuration Example of Amplifier-side Amplitude Detecting Circuit]

Figure 4:
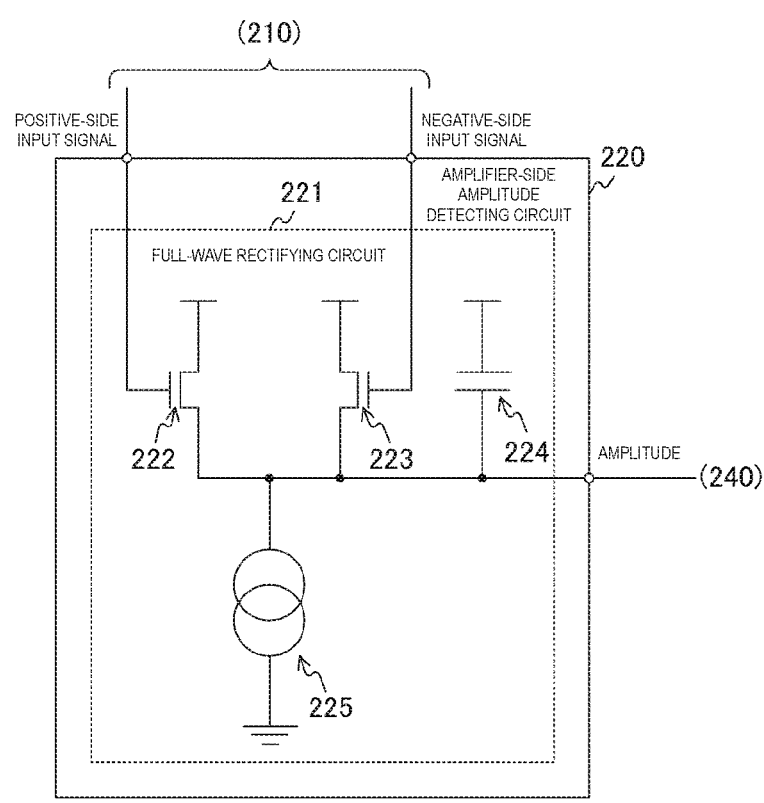
FIG. 4 is a circuit diagram showing a configuration example of an amplifier-side amplitude detecting circuit according to the first embodiment.

FIG. 4 is a circuit diagram showing a configuration example of the amplifier-side amplitude detecting circuit 220 according to the first embodiment. The amplifier-side amplitude detecting circuit 220 includes a full-wave rectifying circuit 221. The full-wave rectifying circuit 221 includes differential transistors 222 and 223, a constant-current source 225, and a capacitor 224. As the differential transistors 222 and 223, for example, an n-type metal-oxide-semiconductor (MOS) transistor is used.

The differential transistor 222 has a gate to which a positive-side input signal after the amplification is input, a drain connected to a power source, and a source connected to the constant-current source 225, the differential transistor 223, the capacitor 224, and the comparator 240. Further, the differential transistor 223 has a gate to which a negative-side input signal after the amplification is input, a drain connected to the power source, and a source connected to the constant-current source 225, the differential transistor 222, the capacitor 224, and the comparator 240. Moreover, one terminal of the capacitor is connected to the power source, and the other terminal is connected to the differential transistors 222 and 223, the constant-current source 225, and the comparator 240. Note that the configuration of the replica-side amplitude detecting circuit 250 is similar to that of the amplifier-side amplitude detecting circuit 220.

With the above-mentioned configuration, the differential transistors 222 and 223 output current corresponding to the difference between the positive-side input signal and the negative-side input signal, and the capacitor 224 is charged with the current. Consequently, the amplitude of the differential signal having the positive-side input signal and the negative-side input signal is detected.

Figure 5:
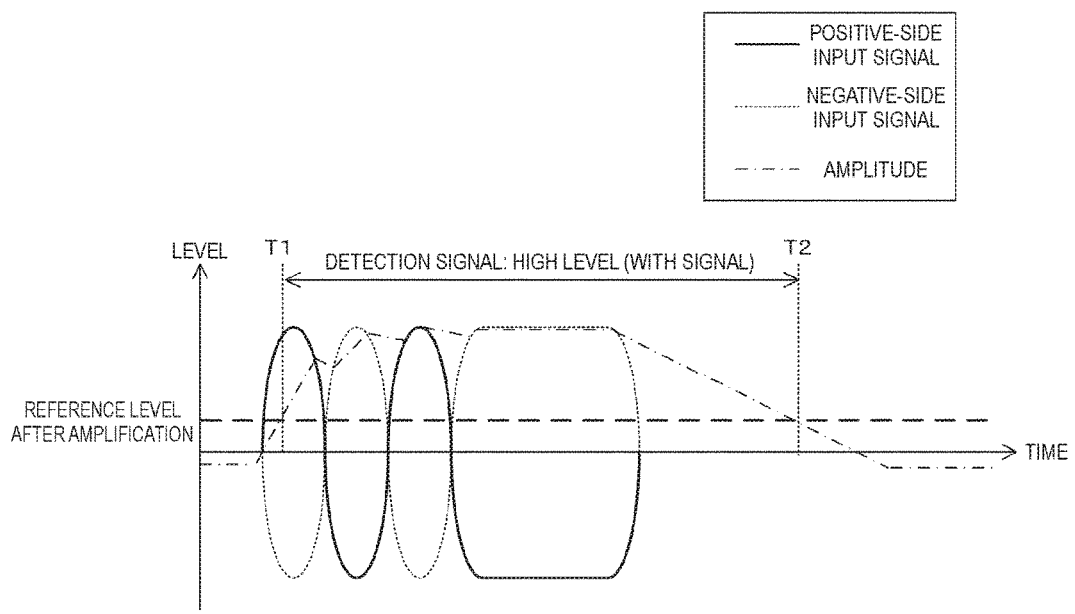
FIG. 5 is a graph showing an example of change in amplitude with time elapse according to the first embodiment.

FIG. 5 is a graph showing an example of the change in amplitude with time elapse according to the first embodiment. In FIG. 5, the ordinate shows the height of the signal level, and the abscissa shows time. Further, a solid line shows the change in signal level of the positive-side input signal, and a thin dotted line shows the change in signal level of the negative-side input signal. A dash-dotted line shows a detection result of the amplitude, and a thick line shows a reference level amplified in the replica circuit 260.

As shown in FIG. 5 as an example, if the amplitude of the differential signal having the positive-side input signal and the negative-side input signal exceeds the reference level after the amplification at time T1, the comparator 240 determines that there is a signal. Then, at time T2, if the amplitude is reduced to the reference level or less after the amplification, it is determined that there is not the signal.

Figure 6A:
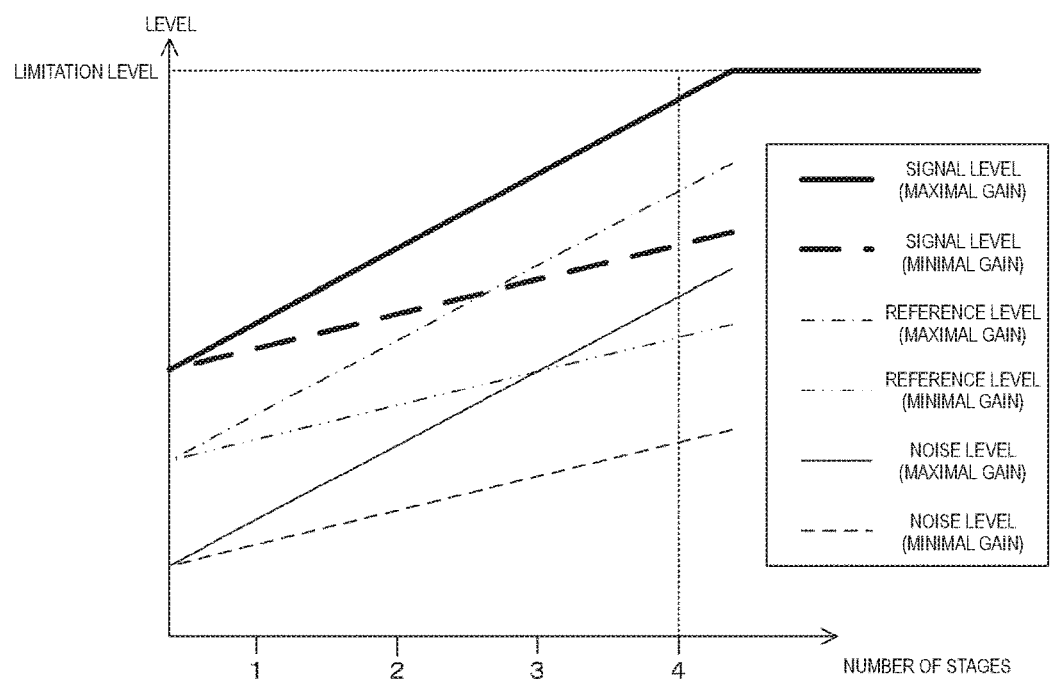
FIGS. 6a and 6b illustrate graphs showing examples of a signal level and a noise level at each stage according to the first embodiment.
Figure 6B:
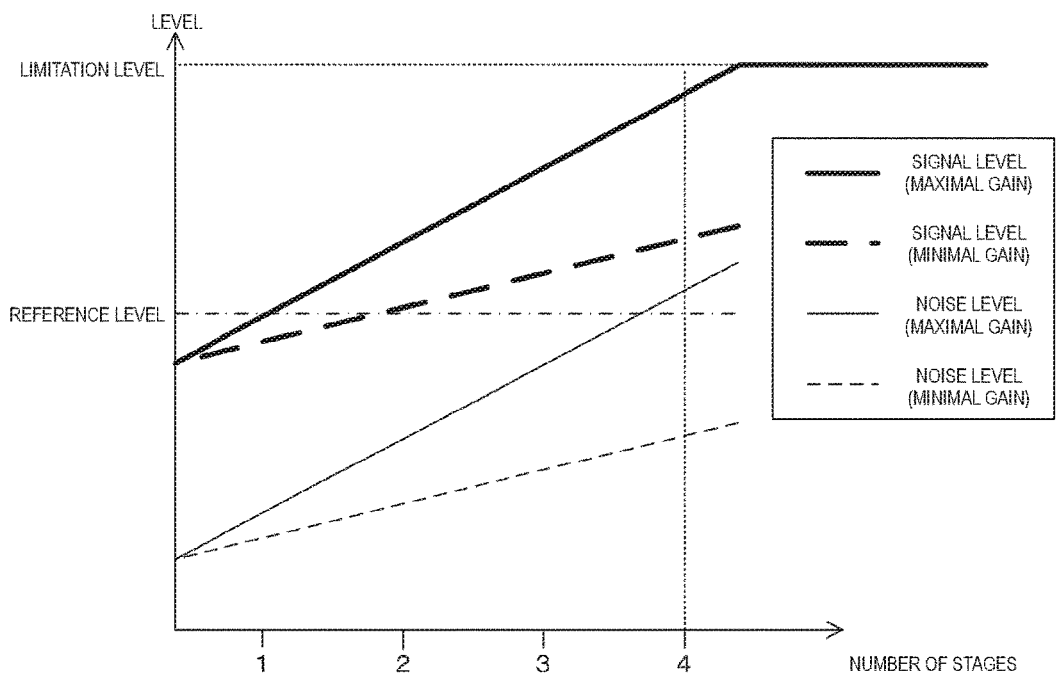

FIGS. 6a and 6b illustrate graphs showing examples of the signal level and the noise level at each stage according to the first embodiment, the ordinate in FIGS. 6a and 6b showing the signal level and the abscissa thereof showing the number of stages of the amplifier, in which FIG. 6a is a graph showing examples of the signal level and noise level of the pre-stage amplifier 211 and the replica circuit 260. In FIG. 6a, a thick solid line shows the signal level of the data signal amplified with the maximal gain, and a thick dotted line shows the signal level of the data signal amplified with the minimal gain. Further, a dash-dotted line shows the reference level amplified with the maximal gain, and a double-dashed dotted line shows the reference level amplified with the minimal gain. Furthermore, a thin solid line shows the noise level of noise amplified with the maximal gain, and a thin dotted line shows the noise level amplified with the minimal gain.

On the other hand, FIG. 6b is a graph showing examples of the signal level and the noise level in the signal detector with the reference level as a fixed value as described in Non-Patent Literature 1. In FIG. 6b, a thick solid line shows the signal level of a data signal amplified with maximal gain, and a thick dotted line shows the signal level of a data signal amplified with minimal gain. Further, a dashed-dotted line shows a reference level. Furthermore, a thin solid line shows the noise level amplified with maximal gain, and a thin dotted line shows the noise level amplified with minimal gain.

A case where the gain is maximal with change in PVT condition will be considered. In this case, if the reference level is fixed, as shown in FIG. 6b, there is a danger that the noise level after the amplification exceeds the reference level. As the result, there is a danger that noise is erroneously detected as the data signal. On the other hand, as shown in FIG. 6a, the reference level is also amplified with the same gain in the signal detector 200, and therefore, the noise level after the amplification is the reference level or less, thereby preventing erroneous detection.

Moreover, in a case where the gain is minimal, there is a danger that the signal level after the amplification is the reference level or less and the data signal is erroneously detected to be not present irrespective of an input of the data signal in the signal detector where the reference level is the fixed value. On the other hand, as shown in FIG. 6a, the reference level is also amplified with the same gain in the signal detector 200, and therefore, the signal level after the amplification is higher than the reference level, thereby protecting the erroneous detection.

[Operational Example of Signal Detector]

Figure 7:
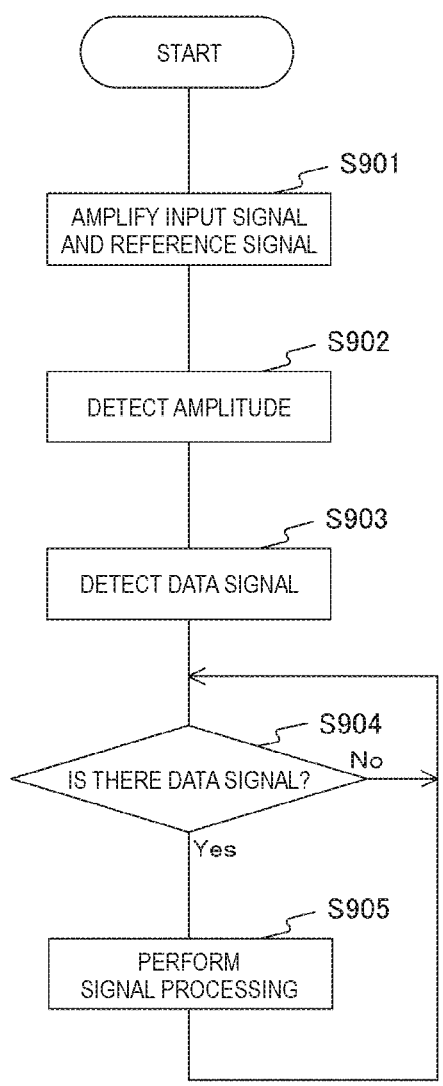
FIG. 7 is a flowchart showing an example of an operation of a communication device according to the first embodiment.

FIG. 7 is a flowchart showing an example of the operation of the communication device 100 according to the first embodiment. The operation starts, for example, when the power source of the communication device 100 is turned on. The limiting amplifier 210 and the replica circuit 260 in the communication device 100 amplify the input signal and the reference signal (step S901).

Then, the amplifier-side amplitude detecting circuit 220 and the replica-side amplitude detecting circuit 250 detect amplitudes of the input signal and the reference signal after the amplification (step S902). The comparator 240 compares the amplitude of the input signal with the amplitude of the reference signal, and detects the presence or absence of the data signal (step S903).

Moreover, the signal processing unit 130 determines whether or not there is the data signal (step S904). In a case where there is the data signal (step S904: Yes), the signal processing unit 130 performs predetermined signal processing (step S905). In a case where there is not the data signal (step S904: No) or after step S905, the signal processing unit 130 returns to step S904.

As mentioned above, according to the first embodiment of the present technology, the signal detector 200 amplifies the input signal and the reference signal with the substantially identical gain, and compares both the signals with each other, thereby accurately detecting the presence or absence of the signal even in a case of increasing or reducing the gain under the PVT condition.

<2. Second Embodiment>

The signal detector 200 of the first embodiment detects the amplitude with the full-wave rectifying circuit 221. However, the amplitude can be detected with a circuit other than the full-wave rectifying circuit 221. For example, the signal detector 200 may detect the amplitude with a peak holding circuit that holds a peak value of the signal. The signal detector 200 of the second embodiment is different from the first embodiment in a point of detecting the amplitude with the peak holding circuit.

Figure 8:
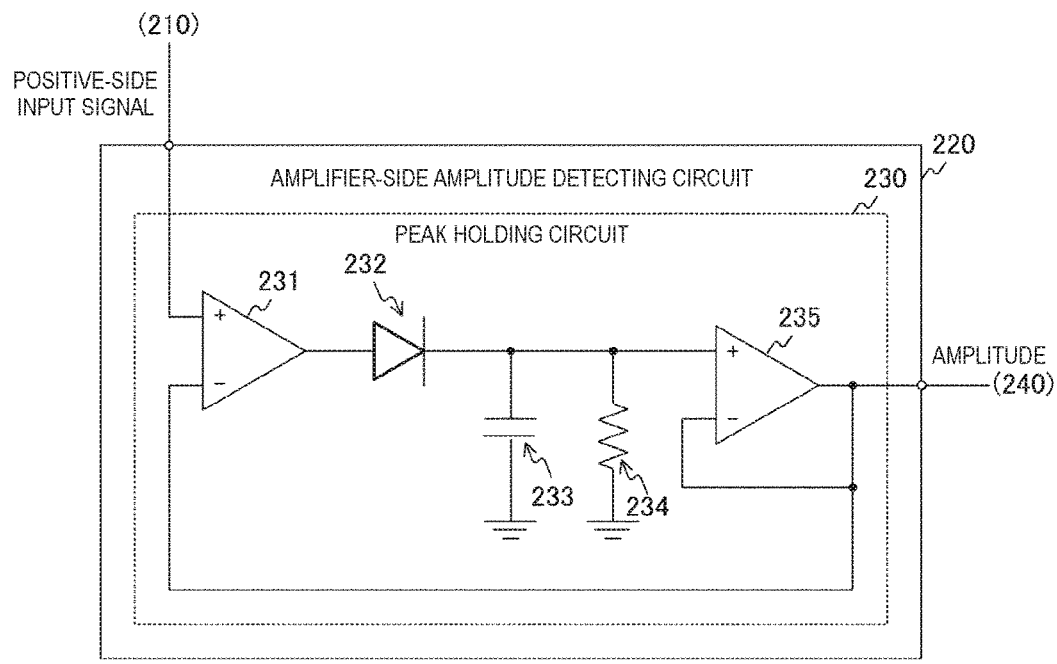
FIG. 8 is a circuit diagram showing a configuration example of an amplifier-side amplitude detecting circuit according to a second embodiment.

FIG. 8 is a circuit diagram showing a configuration example of the amplifier-side amplitude detecting circuit 220 according to the second embodiment. The amplifier-side amplitude detecting circuit 220 of the second embodiment includes a peak holding circuit 230 in place of the full-wave rectifying circuit 221. The peak holding circuit 230 includes: a comparator 231; a diode 232; a capacitor 233; a resistor 234; and an operational amplifier 235.

One of the positive-side input signal and the negative-side input signal after the amplification is input to a non-inverting input terminal (+) of the comparator 231, and an inverting input terminal (−) is connected to an inverting input terminal (−) and an output terminal of the operational amplifier 235 and the comparator 240. Further, an output terminal of the comparator 231 is connected to an anode of the diode 232. Furthermore, a cathode of the diode 232 is connected to the capacitor 233, the resistor 234, and a non-inverting input terminal (+) of the operational amplifier 235. With the configuration, a peak value of the positive-side input signal or the negative-side input signal after the amplification is held to the capacitor 233 as the amplitude. Note that, similarly to the amplifier-side amplitude detecting circuit 220, the peak holding circuit is also provided to the replica-side amplitude detecting circuit 250 of the second embodiment.

Note that the amplifier-side amplitude detecting circuit 220 detects only the peak value of one of the positive-side input signal and the negative-side input signal, but it may detect both the peak values. In this case, a peak holding circuit that detects the peak value of the positive-side input signal and a peak holding circuit that detects the peak value of the negative-side input signal are provided to the amplifier-side amplitude detecting circuit 220. Further, a circuit for obtaining an average of respective peak values is provided to the post stages of the peak holding circuits.

Moreover, the amplifier-side amplitude detecting circuit 220 may convert the differential signal into a single-end signal, and then detect the peak value. In this case, a converting circuit that converts the differential signal into a single-end signal is further provided to the pre-stage of the peak holding circuit 230.

As mentioned above, according to the second embodiment, the signal detector 200 includes the peak holding circuit 230 that detects the peak values of the input signal and the reference signal as amplitudes, thereby detecting the presence or absence of a periodic signal such as a clock signal.

<3. Third Embodiment>

In the signal detector 200 of the above-described first embodiment, offset voltages of the limiting amplifier 210 and the replica circuit 260 are not compensated. However, if the offset voltage is high, a duty ratio of the output signal is changed, and there is a danger that a duty error is caused in the signal processing unit 130. Therefore, preferably, an offset compensating circuit that compensates for the offset voltage is provided. The signal detector 200 of the third embodiment is different from that of the first embodiment in a point that the offset compensating circuit is provided.

Figure 9A:
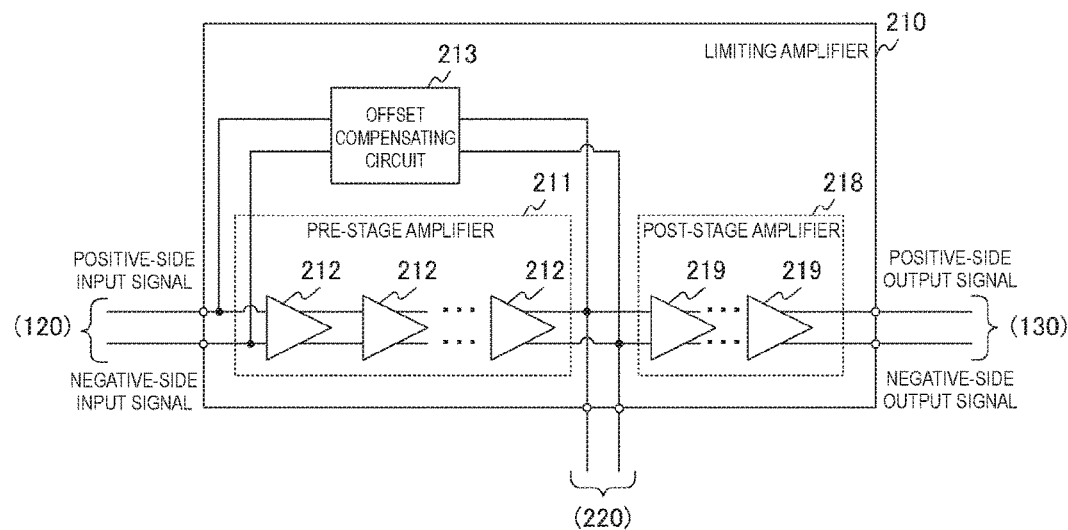
FIGS. 9a and 9b illustrate circuit diagrams showing configuration examples of a limiting amplifier and a replica circuit according to a third embodiment.
Figure 9B:
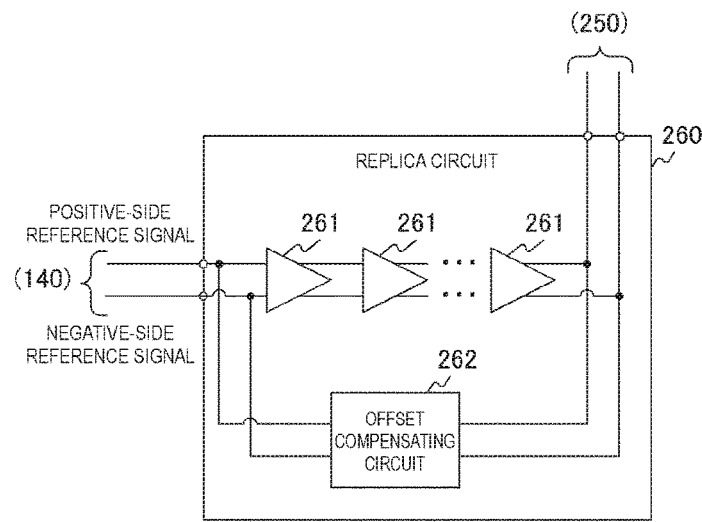

FIGS. 9a and 9b are circuit diagrams showing configuration examples of the limiting amplifier 210 and the replica circuit 260 according to the third embodiment, in which FIG. 9a is a circuit diagram showing a configuration example of the limiting amplifier 210 according to the third embodiment, and FIG. 9b is a circuit diagram showing a configuration example of the replica circuit 260 according to the third embodiment.

The limiting amplifier 210 of the third embodiment is different from that of the first embodiment in a point of further having an offset compensating circuit 213. The offset compensating circuit 213 feeds back a signal output from the differential amplifier 212 at the final stage to an input terminal of the differential amplifier 212 at the first stage, and compensates for an offset voltage.

Herein, in consideration of an offset voltage $V_{ofs}$, a voltage $V_{out}$ of the signal amplified by the pre-stage amplifier 211 is expressed by the following formula.

$$V_{out} = Ga \times (V_{in+} - V_{in-} + V_{ofs})$$

In the above formula, $V_{in+}$ is a voltage of a positive-side input signal, and $V_{in-}$ is a voltage of the negative-side input signal.

The offset compensating circuit 213 generates a voltage $(-V_{ofs})$ that compensates for the offset voltage $V_{ofs}$ on the basis of the signal output from the differential amplifier 212 at the final stage, and feeds back the voltage to the first stage.

In addition, an offset compensating circuit 262 is further provided also to the replica circuit 260 of the third embodiment.

Note that the offset compensating circuit 213 is an example of an input-side offset compensating circuit according to the claims, and the offset compensating circuit 262 is an example of a reference-side offset compensating circuit according to the claims.

As mentioned above, according to the third embodiment of the present technology, the signal detector 200 includes the offset compensating circuit 213 that generates and feeds back a voltage for compensating for the offset voltage, thereby suppressing the generation of an error with the offset voltage.

<4. Fourth Embodiment>

The signal detector 200 of the above-described third embodiment removes the offset voltage with the offset compensating circuit. The offset voltage is a DC component, and therefore, it is possible to remove the offset voltage by providing a high-pass filter that preferentially passes an AC component in place of the offset compensating circuit. The signal detector 200 of the fourth embodiment is different from that of the third embodiment in a point of removing the offset voltage with the high-pass filter.

Figure 10A:
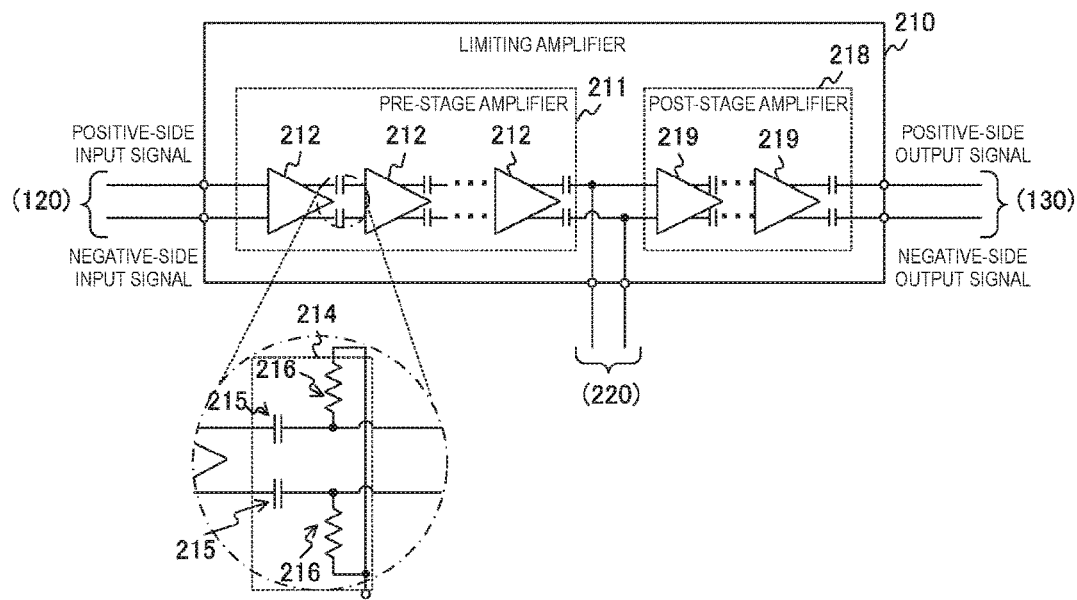
FIGS. 10a and 10b illustrate circuit diagrams showing configuration examples of a limiting amplifier and a replica circuit according to a fourth embodiment.
Figure 10B:
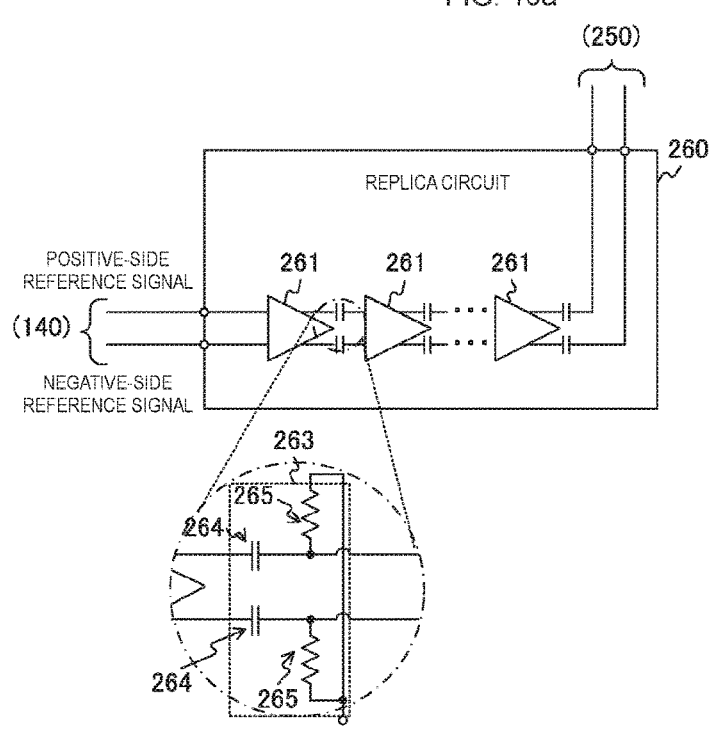

FIGS. 10a and 10b illustrate circuit diagrams showing configuration examples of the limiting amplifier 210 and the replica circuit 260 according to the fourth embodiment, in which FIG. 10a is a circuit diagram showing a configuration example of the limiting amplifier 210 according to the fourth embodiment, and FIG. 10b is a circuit diagram showing a configuration example of the replica circuit 260 according to the fourth embodiment.

In the pre-stage amplifier 211 of the fourth embodiment, a high-pass filter 214 having a capacitor 215 and a resistor 216 is provided to each differential amplifier 212. Similarly, also in the post-stage amplifier 218, the high-pass filter 214 is provided to each differential amplifier 219. Note that, in FIG. 10a, the resistor 216 other than the first stage is omitted for the purpose of convenience of the description. Here, the high-pass filter 214 is provided to each differential amplifier 212, but the embodiment is not limited to the configuration, and the number of the high-pass filters 214 can be changed according to necessity. For example, the high-pass filter 214 may be provided to every two differential amplifiers 212.

The capacitor 215 and the resistor 216 are provided to the positive and negative sides, respectively. The capacitor 215 on the positive side is inserted between the positive-side output terminal of the corresponding differential amplifier 212 and the positive-side input terminal at the post stage thereof. Similarly, the negative-side capacitor 215 is inserted between the negative-side output terminal of the differential amplifier 212 and the negative-side input terminal at the post stage thereof. One terminal of the positive-side resistor 216 is connected to the positive-side capacitor 215 and the negative-side input terminal of the differential amplifier 212, and the other terminal thereof is connected to a common terminal. Similarly, one terminal of the negative-side resistor 216 is connected to the positive-side capacitor 215 and the negative-side input terminal of the differential amplifier 212, and the other terminal thereof is connected to the common terminal. The high-pass filters 214 remove a DC current component (offset component, etc.) of a frequency that is a cutoff frequency fc or less, which will be expressed in the following formula, and pass an AC current component at a frequency higher than fc. As mentioned above, a circuit that passes the AC current component and couples the amplifiers is also called AC coupling.

[Math. 1]

$$fc = \frac{1}{2\pi R \cdot C} \qquad \text{Formula 1}$$

In formula 1, R denotes the sum of resistance values of the resistors 215, and the unit thereof is, e.g., Ohm (Ω). C denotes the sum of capacitances of the capacitor 216, and the unit thereof is, e.g., Farad (F). Further, the unit of the cutoff frequency fc is, e.g., Hertz (Hz).

On the other hand, in the replica circuit 260 also, a high-pass filter 263 having a capacitor 264 and a resistor 265 is further provided to each differential amplifier 261. A cutoff frequency by the circuits is set to be substantially identical to the cutoff frequency of the pre-stage amplifier 211. Note that, in FIG. 10b, the resistor 265 other than the first stage is omitted for the purpose of convenience of the description. Here, the high-pass filter 263 is provided to each differential amplifier 261, but the embodiment is not limited to the configuration, and the number of high-pass filters 263 can be changed according to necessity. For example, the high-pass filter 263 may be provided to every two differential amplifiers 261.

Note that the high-pass filter 214 is an example of the input-side high-pass filter according to the claims. Moreover, the high-pass filter 263 is an example of the reference-side high-pass filter according to the claims.

Figure 11:
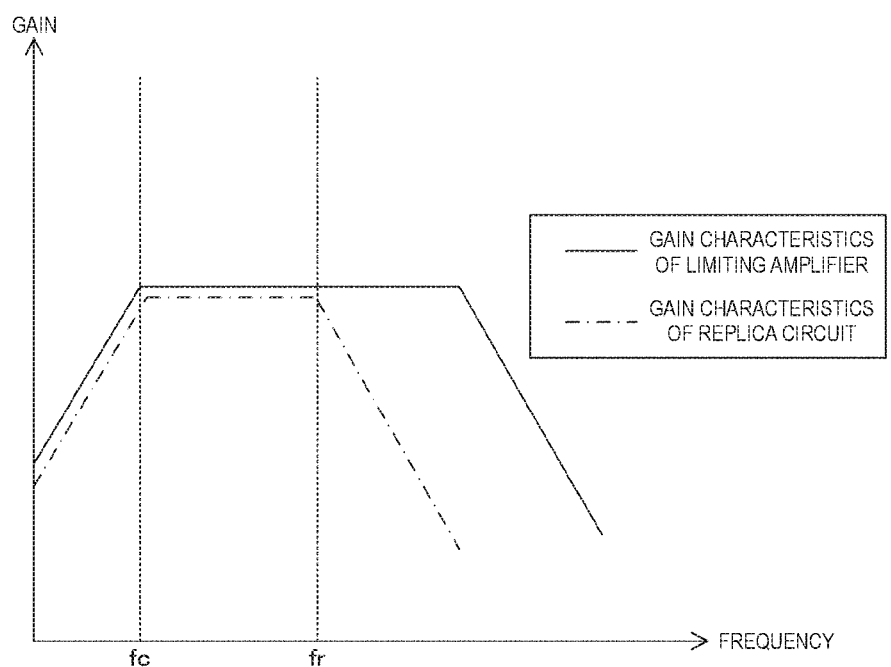
FIG. 11 is a graph showing examples of gain characteristics of the limiting amplifier and the replica circuit according to the fourth embodiment.

FIG. 11 is a graph showing examples of gain characteristics of the limiting amplifier 210 and the replica circuit 260 according to the fourth embodiment. The ordinate in FIG. 11 is gain, and the abscissa is a frequency of the input signal or the reference signal. Further, a solid line shows gain characteristics of the limiting amplifier 210, and a dashed-dotted line shows gain characteristics of the replica circuit 260.

A gain of the limiting amplifier 210 and the replica circuit 260 is changed depending on the frequency in a frequency band that is the cutoff frequency fc of the AC coupling or less. On the other hand, in a frequency band that is higher than the cutoff frequency fc and is a frequency fr or less, the gain is constant irrespective of the frequency. In a frequency band higher than fr, the gain of the replica circuit 260 is changed depending on the frequency, and respective gains of the limiting amplifier 210 and the replica circuit 260 have different values. The frequency in a frequency zone with the constant gain is used as a frequency of the reference signal.

Herein, referring to Formula 1, in case of increasing product RC of a resistance R and capacitance C, the cutoff frequency fc is reduced, and the frequency band in which the gain of the replica circuit 260 is constant can be widened. On the other hand, the mounting area of the replica circuit 260 is increased. However, in a case of setting the reference signal at speed lower than that of the input signal to reduce the power consumption, the wide band is not so required. Therefore, the replica circuit 260 is mounted with a circuit scale thereof being a small area by designing the small RC within a range of efficiently ensuring the frequency band in which the gain of the replica circuit 260 is constant.

As mentioned above, according to the fourth embodiment of the present technology, since the high-pass filters 214 and 263 are provided, it is possible to suppress the generation of an error with the offset voltage by removing the offset voltages of the limiting amplifier 210 and the replica circuit 260.

In addition, the above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

Further, the effects described in the present specification are not limiting but are merely examples, and there may be effects other than the ones described in the present specification.

Additionally, the present technology may also be configured as below.

(1)

A signal detector including:
an input-signal amplifying circuit configured to amplify an input signal with a predetermined gain;
a reference-signal amplifying circuit configured to amplify a reference signal at a constant signal level with a gain that substantially matches the predetermined gain; and
a comparator configured to compare a signal level of the amplified input signal with a signal level of the amplified reference signal and output a comparison result as a detection signal.

(2)

The signal detector according to (1), in which each of the input signal and the reference signal is a periodic signal whose value changes for a constant period, and a frequency of the reference signal is lower than that of the input signal.

(3)

The signal detector according to (2), further including:
an input-signal amplitude detecting circuit configured to detect an amplitude of the amplified input signal and supply the amplitude to the comparator as the signal level; and
a reference-signal amplitude detecting circuit configured to detect an amplitude of the amplified reference signal and supply the amplitude to the comparator as the signal level.

(4)

The signal detector according to (3), in which
the input-signal amplitude detecting circuit detects an amplitude of the input signal with full-wave rectification of the amplified input signal, and
the reference-signal amplitude detecting circuit detects an amplitude of the reference signal with full-wave rectification of the amplified reference signal.

(5)

The signal detector according to (3), in which
the input-signal amplitude detecting circuit detects a peak value of the amplified input signal as an amplitude of the input signal, and
the reference-signal amplitude detecting circuit detects a peak value of the amplified reference signal as an amplitude of the reference signal.

(6)

The signal detector according to any of (1) to (5), in which
the input-signal amplifying circuit includes
an input-side amplifier configured to amplify the input signal with the predetermined gain, and
an input-side offset compensating circuit configured to compensate for an offset voltage of the input-side amplifier on a basis of the amplified input signal, and
the reference-signal amplifying circuit includes
a reference-side amplifier configured to amplify the reference signal with the predetermined gain, and
a reference-side offset compensating circuit configured to compensate for an offset voltage of the reference-side amplifier on a basis of the amplified reference signal.

(7)

The signal detector according to any of (1) to (7), in which
the input-signal amplifying circuit includes
an input-side amplifier configured to amplify the input signal with the predetermined gain, and
an input-side high-pass filter configured to pass a high-frequency component higher than a predetermined cutoff frequency, and
the reference-signal amplifying circuit includes
a reference-side amplifier configured to amplify the reference signal with the predetermined gain, and
a reference-side high-pass filter configured to pass a high-frequency component higher than the predetermined cutoff frequency.

(8)

An electronic device including:
an input-signal amplifying circuit configured to amplify an input signal with a predetermined gain;
a reference-signal amplifying circuit configured to amplify a reference signal at a constant signal level with a gain that substantially matches the predetermined gain;
a comparator configured to compare a signal level of the amplified input signal with a signal level of the amplified reference signal and output a comparison result as a detection signal; and
a signal processing unit configured to perform predetermined signal processing on the amplified input signal, in a case where the detection signal indicating that the signal level of the input single is higher than that of the reference signal is output.

(9)

A method for controlling a signal detector, the method including:
an input-signal amplifying step of amplifying, by an input-signal amplifying circuit, an input signal with a predetermined gain;
a reference-signal amplifying step of amplifying, by a reference-signal amplifying circuit, a reference signal at a constant signal level with a gain that substantially matches the predetermined gain; and
a comparing step of comparing, by a comparator, a signal level of the amplified input signal with a signal level of the amplified reference signal and outputting the comparison result as a detection signal.

REFERENCE SIGNS LIST 100 communication device
110 photoelectrically converting unit
111 photodiode
120 current-voltage converting circuit
130 signal processing unit
140 reference-signal generating unit
200 signal detector
210 limiting amplifier
211 pre-stage amplifier
212, 219, 261 differential amplifier
213, 262 offset compensating circuit
214, 263 high-pass filter
215, 224, 233, 264 capacitor
216, 234, 265 resistor
218 post-stage amplifier
220 amplifier-side amplitude detecting circuit
221 full-wave rectifying circuit 222, 223 differential transistor
225 constant-current source
230 peak holding circuit
231 comparator
232 diode
235 operational amplifier
240 comparator
250 replica-side amplitude detecting circuit
260 replica circuit

The invention claimed is:

1. A signal detector, comprising:
a comparator;
an input-signal amplifying circuit configured to amplify an input signal with a first gain;
a reference-signal amplifying circuit configured to amplify a reference signal, wherein the amplification of the reference signal is at a constant signal level with a second gain substantially same as the first gain;
an input-signal amplitude detecting circuit configured to:
detect an amplitude of the amplified input signal; and
supply the detected amplitude of the amplified input signal as a first signal level to the comparator; and
a reference-signal amplitude detecting circuit configured to:
detect an amplitude of the amplified reference signal; and
supply the detected amplitude of the amplified reference signal as a second signal level to the comparator,
wherein the comparator is configured to:
compare the first signal level of the amplified input signal with the second signal level of the amplified reference signal; and
output a comparison result of the comparison as a detection signal.

2. The signal detector according to claim 1, wherein
each of the input signal and the reference signal is a periodic signal,
a value of the periodic signal changes for a constant period, and
a frequency of the reference signal is lower than a frequency of the input signal.

3. The signal detector according to claim 1, wherein:
the input-signal amplitude detecting circuit is further configured to detect the amplitude of the amplified input signal with full-wave rectification of the amplified input signal, and
the reference-signal amplitude detecting circuit is further configured to detect the amplitude of the amplified reference signal with full-wave rectification of the amplified reference signal.

4. The signal detector according to claim 1, wherein:
the input-signal amplitude detecting circuit is further configured to detect a peak value of the amplified input signal as the amplitude of the amplified input signal, and
the reference-signal amplitude detecting circuit is further configured to detect a peak value of the amplified reference signal as the amplitude of the amplified reference signal.

5. The signal detector according to claim 1, wherein
the input-signal amplifying circuit includes:
an input-side amplifier configured to amplify the input signal with the first gain; and
an input-side offset compensating circuit configured to compensate for an offset voltage of the input-side amplifier based on the amplified input signal, and
the reference-signal amplifying circuit includes:
a reference-side amplifier configured to amplify the reference signal with the second gain; and
a reference-side offset compensating circuit configured to compensate for an offset voltage of the reference-side amplifier based on the amplified reference signal.

6. The signal detector according to claim 1, wherein
the input-signal amplifying circuit includes:
an input-side amplifier configured to amplify the input signal with the first gain; and
an input-side high-pass filter configured to pass a first high-frequency component higher than a cutoff frequency of the input-side high-pass filter, and
the reference-signal amplifying circuit includes:
a reference-side amplifier configured to amplify the reference signal with the second gain; and
a reference-side high-pass filter configured to pass a second high-frequency component higher than a cutoff frequency of the reference-side high-pass filter.

7. An electronic device, comprising:
a comparator;
an input-signal amplifying circuit configured to amplify an input signal with a first gain;
a reference-signal amplifying circuit configured to amplify a reference signal, wherein the amplification of the reference signal is at a constant signal level with a second gain substantially same as the first gain;
an input-signal amplitude detecting circuit configured to:
detect an amplitude of the amplified input signal; and
supply the detected amplitude of the amplified input signal as a first signal level to the comparator;
a reference-signal amplitude detecting circuit configured to:
detect an amplitude of the amplified reference signal; and
supply the detected amplitude of the amplified reference signal as a second signal level to the comparator,
wherein the comparator is configured to:
compare the first signal level of the amplified input signal with the second signal level of the amplified reference signal; and
output a comparison result of the comparison as a detection signal; and
a signal processing unit configured to process the amplified input signal based on the detection signal, wherein the detection signal indicates that the first signal level is higher than the second signal level.

8. A method for controlling a signal detector, the method comprising:
amplifying, by an input-signal amplifying circuit, an input signal with a first gain;
amplifying, by a reference-signal amplifying circuit, a reference signal,
wherein the amplification of the reference signal is at a constant signal level with a second gain substantially same as the first gain;
detecting, by an input-signal amplitude detecting circuit, an amplitude of the amplified input signal;
supplying, by the input-signal amplitude detecting circuit, the detected amplitude of the amplified input signal as a first signal level to a comparator;
detecting, by a reference-signal amplitude detecting circuit, an amplitude of the amplified reference signal;

supplying, by the reference-signal amplitude detecting circuit, the detected amplitude of the amplified reference signal as a second signal level to the comparator;

comparing, by the comparator, the first signal level of the amplified input signal with the second signal level of the amplified reference signal; and outputting, by the comparator, a comparison result of the comparison as a detection signal.

* * * * *